United States Patent
Brichard et al.

(10) Patent No.: US 9,583,896 B2
(45) Date of Patent: Feb. 28, 2017

(54) CONNECTOR FOR MEDICAL DEVICE

(71) Applicant: Intuitive Surgical Operations, Inc., Sunnyvale, CA (US)

(72) Inventors: Dominique Brichard, San Jose, CA (US); Peter M. Herzlinger, Saratoga, CA (US); Willard Curtis Lomax, Sunnyvale, CA (US)

(73) Assignee: Intuitive Surgical Operations, Inc, Sunnyvale, CA (US)

( * ) Notice: Subject to any disclaimer, the term of this patent is extended or adjusted under 35 U.S.C. 154(b) by 311 days.

(21) Appl. No.: 14/307,094

(22) Filed: Jun. 17, 2014

(65) Prior Publication Data

US 2015/0004837 A1 Jan. 1, 2015

Related U.S. Application Data

(60) Provisional application No. 61/839,719, filed on Jun. 26, 2013.

(51) Int. Cl.
*H01R 24/30* (2011.01)
*H05K 1/02* (2006.01)
*H01R 13/6595* (2011.01)

(52) U.S. Cl.
CPC .......... *H01R 24/30* (2013.01); *H01R 13/6595* (2013.01); *H05K 1/0201* (2013.01); *H01R 2201/12* (2013.01)

(58) Field of Classification Search
CPC .............. H01R 12/716; H01R 13/6594; H01R 13/6658; H01R 2201/12; H01R 13/5213; Y10S 439/909

USPC ........ 439/620.21, 76.1, 485, 607.35, 620.22, 439/909
See application file for complete search history.

(56) References Cited

U.S. PATENT DOCUMENTS

| | | | | |
|---|---|---|---|---|
| 4,992,061 A * | 2/1991 | Brush, Jr. | .......... | H01R 13/7195 439/620.1 |
| 5,509,823 A * | 4/1996 | Harting | .................. | H01R 12/57 439/607.17 |
| 5,913,690 A * | 6/1999 | Dechelette | ......... | H01R 23/6873 439/108 |
| 8,066,531 B2 * | 11/2011 | Kanatsu | ............. | H01R 13/6588 439/607.34 |

(Continued)

OTHER PUBLICATIONS

Vertut, Jean and Phillipe Coiffet, Robot Technology: Teleoperation and Robotics Evolution and Development, English translation, Prentice-Hall, Inc., Inglewood Cliffs, NJ, USA 1986, vol. 3A, 332 pages.

*Primary Examiner* — Tulsidas C Patel
*Assistant Examiner* — Travis Chambers

(57) ABSTRACT

A connector system employs an electromechanical connector to connect to a complementary electromechanical connector on an electronic device in a medical system. A shroud surrounds the electromechanical connector and is conductive and shaped to provide a thermal contact to the electronic device. A shielded cable can be electrically coupled to the electromechanical connector and extending through an opening in the shroud, and an electromagnetic shield attaches to the shroud and surrounds the portion of the shielded cable extending from the shroud. A mechanical lock may be included with a spring to press the shroud against the electronic device when the mechanical lock engages the electronic device.

16 Claims, 2 Drawing Sheets

(56) References Cited

U.S. PATENT DOCUMENTS

| | | | | |
|---|---|---|---|---|
| 8,591,262 B2* | 11/2013 | Schaffer | ............ | H01F 5/003 336/170 |
| 8,986,046 B2* | 3/2015 | Smith | ............ | H01R 13/6658 439/620.22 |
| 9,022,800 B2* | 5/2015 | Yang | ............ | H01R 13/6581 439/487 |
| 2008/0207021 A1* | 8/2008 | Hsu | ............ | H01R 13/6658 439/79 |

* cited by examiner

CONNECTOR FOR MEDICAL DEVICE

BACKGROUND

Electronic devices such as camera systems used in or with minimally invasive medical instruments generally have stringent performance requirements. In particular, such devices must be small enough, e.g., less than about 10 mm in diameter, to be inserted through a cannula or other guide and must be long enough to reach a work site within a patient in order to perform the required function. For example, a camera system for a minimally invasive medical instrument must be able to provide a surgeon or other clinical personnel with moving images, typically stereoscopic views, of sufficient clarity to enable precision procedures. The high image quality and reasonable frame rates generally require high-frequency data transmissions for digital transmission (e.g., from CMOS cameras) along the relatively long length of the instrument. The long signal path and metal employed in a shaft or other part of the medical instrument can unintentionally provide an effective antenna that could generate electromagnetic interference (EMI) particularly from high frequency data signals. Careful shielding of signals, particularly data signals, may thus be required.

Another issue for electronic devices in minimally invasive systems is generation and dissipation of heat. For a typical minimally invasive medical system, the heat generated from operation of a distal electronic device must be removed from a work site within a patient. Otherwise, heat buildup within the patient may interfere with operation of the device or worse injure the patient. Active cooling systems, e.g., that rely on electro-mechanical cooling techniques such as air or water flow or thermoelectric cooling devices, may consume premium space within the instrument and increase the complexity of the instrument. To provide a more compact device, passive cooling that conducts heat from the distal tip of the instrument may be used, but a heat conduction path from the distal tip of the instrument may be narrow and long, restricting heat flow and increasing the operating temperature of the electronic device. A mounting for an electronic device such as a camera system that is passively cooled should thus provide a thermal contact with low resistance to heat flow regardless of the length or narrowness of the heat path.

Yet another issue for connecting an electronic device at the distal end of a minimally invasive medical instrument is the ability of the connection to withstand forces that occur when the instrument moves or flexes. For example, a camera system at the distal end of a probe may need to be positioned and pointed for viewing of a work site from a user selected viewing point. A connector for such an electronic device must thus be able not only to withstand the forces that movement of the electronic device causes but also maintain electrical connections, EMI shielding, and a low-resistance thermal connection during such movement.

SUMMARY

In accordance with an aspect of the invention, a system for connecting an electronic device at the distal end of a medical instrument provides an EMI barrier and a thermal path for passive cooling of the electronic device. In one aspect, the connector may include a shroud that shields an inner connector to the device and the inner and outer layers of shielding may respectively extend from the inner connector and the shroud. In another aspect, a lock mechanism may press the shroud against the electronic device to provide shielding and effective thermal and electrical contact to the electronic device even when the device moves. In yet another aspect, an electrical device for use on a distal end of a medical instrument can include an inner connector and a surrounding ring shaped to contact a shroud and provide an outer EMI barrier, an electrical connection, and a thermal connection. Some embodiments may employ a dual shielded connector that provides reliable electrical connections, a secure mechanical mount, a low-thermal resistance contact for passive cooling, and effective electromagnetic shielding. In some configurations, the dual shielded connector is a dual coaxial connector in which an inner shield is coaxial with an outer shield, and both shields surround one or more signal wires. Further, the inner and outer shields can be maintained at different constant voltages, e.g., power supply voltage and ground voltage respectively, which may stabilize the operating voltage difference provided through the shields to a distal electronic device.

One specific embodiment is a connector system including an electromechanical connector, a shroud, a shielded cable, and an outer shield, and a mechanical lock. The electromechanical connector may reside within the shroud and be adapted to connect to a complementary electromechanical connector on an electronic device in a medical system. The shroud can be conductive and shaped to provide a thermal and/or electrical contact to the electronic device. The shielded cable electrically couples to the electromechanical connector and extends through an opening in the shroud, and the outer shield attaches to the shroud and surrounds a portion of the shielded cable extending from the shroud. The mechanical lock includes a spring to press the shroud against the electronic device when the mechanical lock engages the electronic device.

Another specific embodiment is an electrical device for use on a distal end of a medical instrument. The device includes a substrate, an electrical component mounted on the substrate, a connector mounted on a proximal face of the substrate and electrically connected to the electrical component, and a ring or trace surrounding the connector on the proximal face of the substrate and electrically connected to the electrical component. The device may include or be used with a shroud having a contact area and sides that extend from the contact area. The substrate may have a perimeter shaped to contact sides of a shroud, and the ring may be positioned to contact the contact area of the shroud.

BRIEF DESCRIPTION OF THE DRAWINGS

The drawings illustrate examples for the purpose of explanation and are not the invention itself Use of the same reference symbols in different figures indicates similar or identical items.

DETAILED DESCRIPTION

A connector for an electronic device such as a camera, a sensor, or a clinical system in a minimally-invasive medical instrument employs dual shielding and includes an end cap or shroud that may be spring loaded to provide robust thermal and electrical connections to the electronic device. A shield that is grounded or otherwise biased to prevent enclosed signals from generating electromagnetic interference (EMI) may be attached to the shroud to conduct and remove heat that the electronic device generates. Spring loading of the shroud allows the shroud to maintain effective electrical and thermal connections to the electronic device even when the electronic device moves or the connecting wires flex and bend. A mechanical lock system can bias a spring that presses the shroud against a thermally and/or electrically conductive ring that may enclose active circuit elements of the electronic device.

Figure 1A:
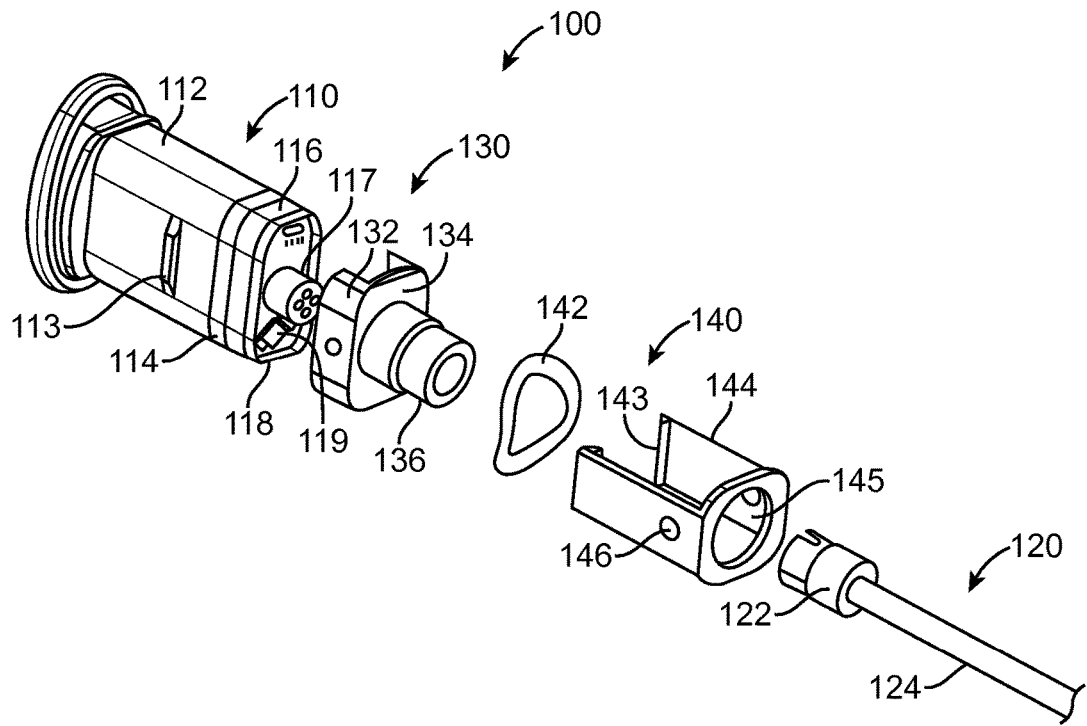
FIGS. 1A and 1B respectively show exploded and assembled views of a system including a double shielded connector in accordance with an embodiment of the invention.
Figure 1B:
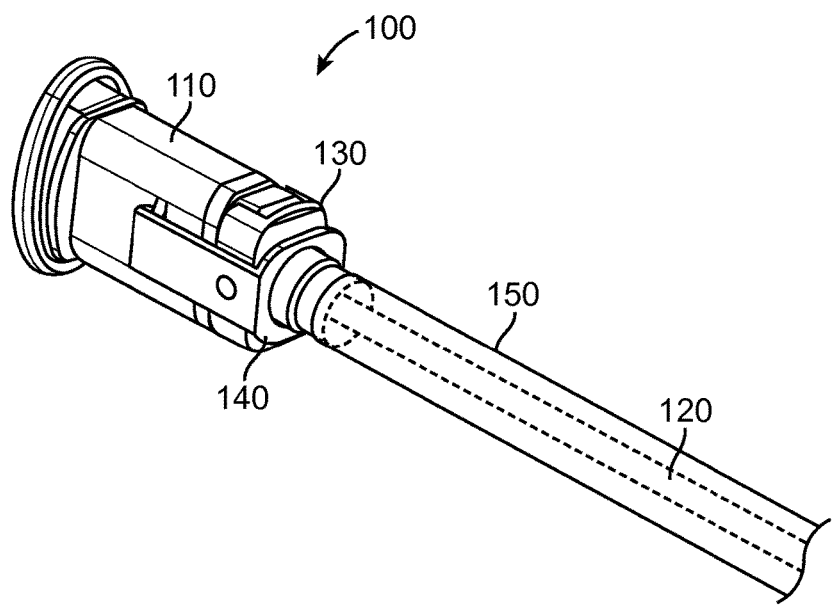

FIGS. 1A and 1B respectively show exploded and assembled views of a distal portion 100 of a minimally-invasive medical probe including an electronic device 110. As a specific example, the following assumes that electronic device 110 is a camera module. Camera modules with an optical system 112 and electronics at the distal end of a medical probe generally require power, ground, control signals, data signals, and thermal cooling. Camera modules may also produce or receive high-frequency electrical signals, with frequency content greater than 30 MHz, and accordingly require effective shielding to prevent EMI. However, other instruments containing electronic devices such as electrical distal controls or electrical sensors, e.g., RF sensors, temperature, force, pressure or shape sensors may have some or all of the same requirements and could employ connector systems similar to those used for camera modules. In the illustrated system, electronic device 110 contains a primary semiconductor chip and other electronic components 119 that may be mounted on a substrate 116. The primary chip, which may be on the distal face of substrate 116 and not visible in FIG. 1A or 1B, may be within a ring 114 that allows electronic device 110 to be hermetically sealed. Ring 114 around the primary chip may thermally and electrically contact the primary chip within electronic device 110, for example, to provide a ground signal and provide a low resistance path for conducting heat away from a camera or other semiconductor chip that needs to be on a distal face of substrate 116. Ring 114 may be an electro-mechanical part packaging for a primary chip or other electronic components on the distal face of substrate 116 and may encircle the primary chip or any electrical components on the distal face of substrate 116. Ring 114 may also be electrically conductive to provide a low resistance electrical path and reduce EMI generation.

Substrate 116 may be a circuit board or a ceramic substrate on which the primary semiconductor chip is mounted, e.g., soldered, wirebonded or epoxied, on substrate 116. The primary chip may need to be on the distal face of substrate 116 in order to function properly, e.g., a camera chip may need to be optically exposed to the environment to be sensed, but alternatively, some or all chips and other active electrical components 119 could be on the proximal face of substrate 116 if a chip exposed to the work site is not required. An electromechanical socket or plug 117 (e.g., one half of a mated connector) and a contact ring 118 are on the proximal face of substrate 116. Conductive traces and passive or active electronic components may also reside in, on, or through substrate 116. In particular, metal traces (not shown) running on or through substrate 116 may electrically connect respective terminal, contact pads, or pins of distal or proximal chips to pins of inner connector 117, to contact ring 118, and to ring 114. Additionally, other electronic components may be attached, e.g., soldered, wire bonded, or epoxied, to substrate 116 in a manner that provides thermal conduction of heat from the active components through substrate 116. Contact ring 118 may be a ground ring that is soldered onto substrate 116 during a surface mount technology (SMT) process and may extend out from substrate 116 to create sides of a cavity containing electromechanical connector 117 and other passive or active electronic components on substrate 116. Alternatively, contact ring 118 can be a trace on substrate 116 that encircles electromechanical connector 117, and the sides of a shroud 130 can contact ring 118 and form walls of a cavity containing electromechanical connector 117 and other passive or active electronic components on substrate 116. More generally, ring 118 can be any structure providing the desired thermal/electrical pathways, e.g., a sheet or a plate with an opening on the distal side of substrate 116.

Inner connector 117 on substrate 116 may be a multi-pin connector that is shaped or keyed to engage a complementary multi-pin connector 122 on the distal end of a shielded cable 120. In an exemplary configuration, connector 117 includes one or more pins for data, control, power, or ground signals, and when connector 117 engages connector 122, the pins of connector 117 electrically connect through respective pins in connector 122 to respective lines or wires 124. Lines or wires 124 extend from connector 122 at their distal ends through the minimally invasive medical instrument to external control systems or circuits (not shown). In accordance with an aspect of the invention, at least some of wires 124 are shielded, e.g., coaxial cable, or wires 124 may be collectively shielded in a conductive sheath that may surround all wires 124 and may be grounded, at the power supply voltage, or otherwise biased to block EMI from signals propagating on lines or wires 124. Connectors 117 and 122 may have mechanical locking features that resist accidental removal of cable 120 from device 110 when connectors 117 and 122 are connected together, i.e., engaged.

An end cap or shroud 130 made of a thermally and electrically conductive material such as copper or another metal is shaped to have sides 132 that fit around or contact the perimeter edge of substrate 116 and a contact area 134 to electrically and thermally contact perimeter ring 118 around connector 117 on the proximal face of substrate 116. The sides 132 of shroud 130 may extend perpendicularly or at an angle from contact area 134 and may be sufficiently high to contact or enclose the perimeters of substrate 116 and ring 114. Alternatively, particularly when ring 118 is a trace on the proximal face of substrate 116, contact area 134 of shroud 130 may include cavity walls that contact ring 118, and sides 132 may be offset but generally extend further in the same direction as walls of contact area 134. In either case, sides 132 of shroud 130 may be high enough to make contact with the edges of substrate 116 and ring 114. A thermal objective for shroud 130 is to capture as much heat as possible from the electronic components and substrate 116 generally. Shroud 130 may also make the electrical contact for the ground or "GND" for both rings 114 and 118. In the assembled configuration shown in FIG. 1B, electromechanical connector 122 is between shroud 130 and substrate 116 and is connected to electromechanical connector 117. Shroud 130 may be shaped to hold connector 122 in place. Alternatively or additionally, other means such as solder, glue, or a latch system can hold connector 122 in place to avoid dislodging connector 122 during articulation of the distal end of the instrument. Instead of holding connector 122 in place, the shape of shroud 130 when pressed against ring 118 may with cable 120 and electronic device 110 form parts of a cavity providing 360° of EMI shielding of the distal electronics, substrate 116, the electronic devices 119, and connectors 117 and 122 since shroud 130 can enclose most or all of ring 114, substrate 116, ring 118, the electronic devices 119, and connectors 117 and 122. Additionally, shroud 130 can maximize the contact areas with the perimeter of ring 114, the edge of substrate 116, and contact ring 118 on the proximal face of substrate 116. The large contact areas of shroud 130 facilitates thermal conduction of heat from electronic device 110 and may be larger than necessary for electronic purposes, e.g., larger than needed to ground distal or proximal chips or substrate 116.

A mechanical lock system 140 for shroud 130 in the illustrated embodiment includes a spring 142 and a clip 144. Mechanical lock system 140 when engaged with electronic device 110 can bias spring 142 to hold shroud 130 tightly in place against substrate 116 and/or contact ring 118. Accordingly, shroud 130 can maintain a solid electrical and thermal contact to ring 118 and the remainder of electronic device 110 even when cable 120 may move or be bent as electronic device 110 is positioned for use. In the illustrated configuration, spring 142 is a spring washer such as a Belleville, bowed, curved, conical, finger, or wave washer or spacer with an opening through which shielded cable 120 can extend. Clip 144, which may be formed of metal or an electrically conductive material, may fit over spring 142 and shroud 130 and compress spring 142 against shroud 130 when tabs 143 on clip 144 engage complementary slots 113 in electronic device 110. Clip 144 in the illustrated configuration also includes an opening 145 through which a projection 136 on shroud 130 fits and includes injection ports 146 for injection of thermally conductive epoxy such as Arctic Silver Thermal Adhesive.

Projection 136 in the illustrated configuration of shroud 130 is a stepped, cylindrical projection and may capture or hold inner electromechanical connector 122 or may provide a gap or spacing between shroud 130 and inner electromechanical connector 122. Projection 136 on shroud 130 does not need to be cylindrical. For example, if connector 122 is rectangular, projection 136 may have a rectangular cross-section to maintain relatively constant coaxial configuration with connector 122.

A tube-shaped electromagnetic shield 150 may attach to projection 136 and extend from shroud 130, so that shield 150 surrounds shielded cable 120 and both shielded cable 120 and shield 150 extend to the proximal end (not shown) of medical probe 100. Shield 150 could be cylindrical, prismatic or otherwise non-cylindrical, and the structure of shield 150 may be any structure suitable for EMI shielding. For example, shield 150 may be a conductive tube that may be braided metal, conductive foil, or double ground wire serve in opposite directions to make a flexible conductive tube and that is soldered around cylindrical projection 136 of shroud 130. Outer shield 150 can extend the length of the medical instrument and provide a second layer of EMI shielding of wires 124. In one specific configuration, projection 136 and its shield 150 are concentric with connector 122 and shielding on cable 120 in order to provide high capacitance between ground on shield 150 and a power or supply voltage on one of cables 124. Such a high capacitance coupling can help maintain a fixed voltage difference between the supply voltage and ground, which is a particular issue when other electrical devices, e.g., cautery instruments, may operate at the same work site as electrical device 110. Outer shield 150 also provides a thermal path from shroud 130 to the proximal end of the instrument where a heat sink or the surrounding environment can absorb heat conducted away from electronic device 110.

Figure 2:
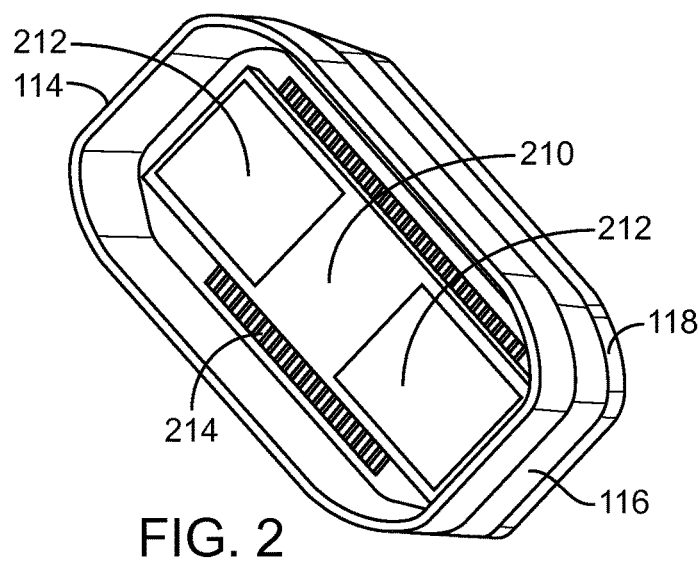
FIG. 2 shows the distal face of a substrate including a ring that shields and provides a heat path for distal electronics.

FIG. 2 shows a view from the distal side of substrate 116 to illustrate a configuration in which ring 114 surrounds and shields a main chip 210. Main chip 210 may, for example, be a stereoscopic camera chip that may be affixed to the distal face of substrate 116 using heat conductive epoxy or any other mounting system that provides a relatively low resistance heat flow path between chip 210 and substrate 116. In the illustrated configuration, chip 210 includes two imaging arrays 212 that need optical access from the distal end of an instrument. As a result, chip 210 may be most conveniently mounted on the distal face of substrate 116. In general, a camera module would further include a lens or other optical system 112 to form images on arrays 212. Terminals 214 of chip 210 are electrically coupled to traces in or on substrate 116 and may connect to other electronic components on the distal or proximal face of substrate 116.

Ring 114, which may be made of an electrically and thermally conductive material such as copper or another metal, is on the distal face of substrate 116 and surrounds chip 210 to provide 360° EMI shielding around chip 210. Ring 114 may also be thicker than chip 210 to provide shielding that extends in the distal direction further than chip 210. In some configurations, ring 114 may also be electrically or thermally connected to chip 210 to provide, e.g., to a ground terminal of chip 210 or to provide a further path for thermal flow. In some other embodiments, the thermal connection from chip 210 to substrate 116 to shroud 130 may be relied on for thermal or an electrical, e.g., ground, connection to chip 210. Ring 118, as described above, may facilitate the thermal and electrical connection of substrate 116 to the shroud.

Figure 3:
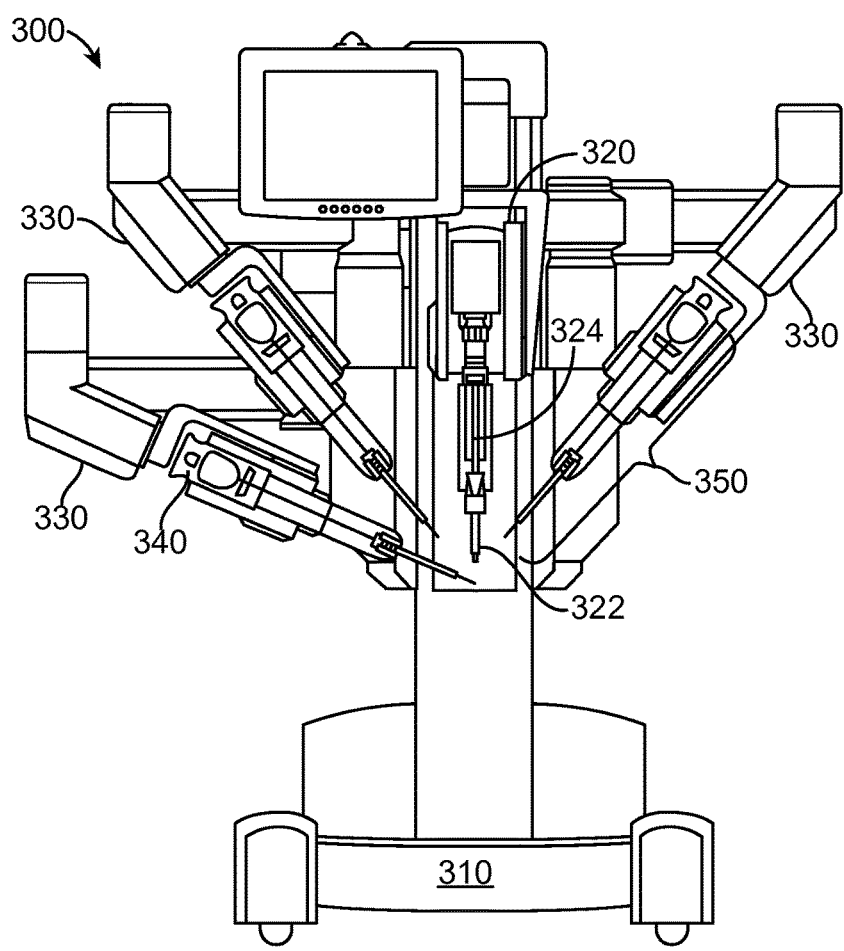
FIG. 3 shows a medical system that can employ vision systems or instruments with distal electronic devices that may be connected, shielded, and cooled in accordance with an embodiment of the invention.

FIG. 3 illustrates an example of a robotically controlled medical system 300, which could employ electronic devices and connector systems such as described above. System 300, which may, for example, be part of a da Vinci® Surgical System available from Intuitive Surgical, Inc., includes a patient-side manipulator 310 having a camera arm 320 and multiple instrument arms 330. Camera arm 320 includes a cannula or other guide 322 through which a camera probe 324 can be inserted, and camera probe 324 may have an electronic camera module at its distal end. During a minimally-invasive medical procedure, the distal end of cannula 322 may be inserted through a small incision to a work site in a patient, and camera probe 324 may be inserted in and guided through cannula 322 to the work site. The position and orientation of the distal tip of camera probe 324 may be user controlled to alter the view point of the work site. In accordance with an aspect of the current invention, a connector system such as described above can be connected to the electronic camera module at the distal end of the camera probe to interface power, ground, control, and data signals with the distal electronics, provide EMI shielding along the entire length of camera probe 324, and provide a thermal path to conduct heat away from the distal electronics.

Instrument arms 330 of system 300 are for mounting of interchangeable medical instruments. In particular, each instrument arm 330 has a docking port 340 to which an instrument 350 may be attached. Each docking port 340 generally includes a drive system with a mechanical interface for mounting and providing mechanical power for manipulation of a distal tip of an instrument 350. Instrument arms 330 can be used during a medical procedure to move and position the distal tips of respective medical instruments 350 for the medical procedure. Some instruments 350 may additionally include a distal electronic device that may be powered and controlled through docking port 340 or other interface circuitry (not shown). For example, some instruments may include an electrical distal control or an electrical sensor, e.g., temperature, force, pressure or shape sensors. A connector system such as described above may be used for the distal electronic devices in interchangeable medical instruments.

Connection systems as described above can provide a combination of desired features for use in a minimally-invasive medical system. In particular, a connector may provide a positive lock so that the electronic device is unlikely to come loose and fail. The connector particularly with the spring action can provide some flexibility to accommodate articulation of the electronic device or movement of the attached cables. The connector may further provide not only electrical connections, electrical isolation, and 360° EMI shielding but also thermal connections to cool the electronic device. Keeping both shields in close proximity keeps capacitance between power and ground high. Since distal electronics may be a floating system, any external perturbation is equally seen by both shields. This means that relative to each other, power and ground are not perturbed by external electrical fields, for instance, from cautery instruments at the same work site.

Although particular implementations have been disclosed, these implementations are only examples and should not be taken as limitations. Various adaptations and combinations of features of the implementations disclosed are within the scope of the following claims.

What is claimed is:

1. A connector system comprising:
    an electromechanical connector to connect to a complementary electromechanical connector on an electronic device in a medical system;
    a shroud in which the electromechanical connector resides, the shroud being conductive and shaped to provide a thermal contact to the electronic device;
    a shielded cable electrically coupled to the electromechanical connector and extending through an opening in the shroud; and
    an electromagnetic shield attached to the shroud and surrounding a portion of the shielded cable extending from the shroud, wherein
    the shroud comprises:
        sides shaped for fit around edges of a substrate of the electronic device;
        a contact area shaped to contact thermal and electrical contact region on a face of the substrate; and
        a projection to which the electromagnetic shield attaches.

2. The system of claim 1, wherein the shielded cable comprises:
    a plurality of wires; and
    shielding surrounding at least one of the wires.

3. A connector system comprising:
    an electromechanical connector to connect to a complementary electromechanical connector on an electronic device in a medical system;
    a shroud in which the electromechanical connector resides, the shroud being conductive and shaped to provide a thermal contact to the electronic device;
    a shielded cable electrically coupled to the electromechanical connector and extending through an opening in the shroud;
    an electromagnetic shield attached to the shroud and surrounding a portion of the shielded cable extending from the shroud; and
    a mechanical lock to press the shroud against the electronic device when the mechanical lock engages the electronic device.

4. The system of claim 3, wherein the mechanical lock comprises a spring to press the shroud against the electronic device when the mechanical lock engages the electronic device.

5. The system of claim 4, wherein the mechanical lock further comprises a clip shaped to engage the electronic device and simultaneously compress the spring to press the shroud against the electronic device.

6. A connector system comprising:
    an electronic device in a medical system;
    an electromechanical connector to connect to a complementary electromechanical connector on the electronic device;
    a shroud in which the electromechanical connector resides, the shroud being conductive and shaped to provide a thermal contact to the electronic device;
    a shielded cable electrically coupled to the electromechanical connector and extending through an opening in the shroud; and
    an electromagnetic shield attached to the shroud and surrounding a portion of the shielded cable extending from the shroud, wherein
    the electronic device comprises:
        a substrate having a proximal face from which the complementary electromechanical connector extends; and
        a thermal and electrical contact ring on the substrate, surrounding the complementary electromechanical connector, and in contact with the shroud.

7. The system of claim 6, wherein the electronic device further comprises a circuit component attached to the substrate and surrounded by the thermal and electrical contact ring.

8. The system of claim 6, wherein the electronic device further comprises a semiconductor chip mounted on the substrate.

9. The system of claim 6, wherein the shroud and the thermal and electrical contact ring form walls of a cavity enclosing the complementary electromechanical connector.

10. An electrical device to mount on a distal end of a medical instrument, the device comprising:
    a substrate having a perimeter shaped to contact sides of a shroud;
    an electrical component mounted on a distal face of the substrate;
    a connector mounted on a proximal face of the substrate and electrically connected to the electrical component;
    a first ring surrounding the connector on the proximal face of the substrate and electrically connected to the electrical component, the first ring being positioned to contact a contact area of the shroud from which the sides extend; and
    a second ring surrounding the electrical component, the second ring being in thermal and electrical contact with the electrical component and having a perimeter shaped to contact the sides of the shroud.

11. The device of claim 10, wherein the substrate comprises ceramic.

12. The device of claim 10, further comprising the shroud, wherein the shroud has a projection that surrounds the connector.

13. The device of claim 12, wherein the shroud makes thermal contact to the perimeter of the substrate and makes thermal and electrical contact to the first ring.

14. An electrical device to mount on a distal end of a medical instrument, the device comprising:
- a shroud;
- a substrate having a perimeter shaped to contact sides of a shroud;
- an electrical component mounted on the substrate;
- a connector mounted on a proximal face of the substrate and electrically connected to the electrical component, wherein the shroud has a projection that surrounds the connector;
- a first ring surrounding the connector on the proximal face of the substrate and electrically connected to the electrical component, the first ring being positioned to contact a contact area of the shroud from which the sides extend; and
- a clip and a spring positioned to press the contact area of the shroud against the first ring.

15. The device of claim 14, wherein the electrical component is mounted on a distal face of the substrate.

16. The device of claim 15, further comprising a second ring surrounding the electrical component, the second ring being in thermal and electrical contact with the electrical component and having a perimeter shaped to contact the sides of the shroud.

\* \* \* \* \*